(12) United States Patent
Okubo

(10) Patent No.: US 7,794,900 B2
(45) Date of Patent: Sep. 14, 2010

(54) MASK BLANK SUBSTRATE MANUFACTURING METHOD, MASK BLANK MANUFACTURING METHOD, MASK MANUFACTURING METHOD, AND MASK BLANK SUBSTRATE

(75) Inventor: Yasushi Okubo, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 12/632,900

(22) Filed: Dec. 8, 2009

(65) Prior Publication Data
US 2010/0081069 A1 Apr. 1, 2010

Related U.S. Application Data

(62) Division of application No. 12/187,052, filed on Aug. 6, 2008, now Pat. No. 7,648,807.

(30) Foreign Application Priority Data
Aug. 7, 2007 (JP) ............................. 2007-204922

(51) Int. Cl.
*G03F 9/00* (2006.01)

(52) U.S. Cl. ............................ 430/5; 430/322; 430/323; 430/324

(58) Field of Classification Search ..................... 430/5, 430/322, 323, 324
See application file for complete search history.

(56) References Cited

U.S. PATENT DOCUMENTS

2006/0246361 A1   11/2006   Kurikawa et al.

FOREIGN PATENT DOCUMENTS

| JP | 2001-33941 A | 2/2001 |
|----|---|---|
| JP | 2002-116533 A | 4/2002 |
| JP | 2006-309143 A | 11/2006 |
| WO | 2005/079470 A2 | 9/2005 |

*Primary Examiner*—Christopher G Young
(74) *Attorney, Agent, or Firm*—Sughrue Mion, PLLC

(57) ABSTRACT

An object of this invention is to properly identify or manage mask blank substrates, mask blanks, and so on. A manufacturing method of a mask blank substrate (10) includes a substrate preparing step of preparing a plate-like substrate with a square main surface (102), and a marker forming step of forming a marker (106a to 106d) for identifying or managing the substrate on each of at least a plurality of end faces among four end faces (104a to 104d) of the substrate. The four end faces are continuous with sides of the main surface, respectively.

30 Claims, 6 Drawing Sheets

MASK BLANK SUBSTRATE MANUFACTURING METHOD, MASK BLANK MANUFACTURING METHOD, MASK MANUFACTURING METHOD, AND MASK BLANK SUBSTRATE

This is a Divisional of U.S. application Ser. No. 12/187,052 filed Aug. 6, 2008, which claims the benefit of priority from Japanese patent application No. 2007-204922, filed on Aug. 7, 2007, the disclosure of which is incorporated herein in its entirety by reference.

TECHNICAL FIELD

This invention relates to a mask blank substrate manufacturing method, a mask blank manufacturing method, a mask manufacturing method, and a mask blank substrate.

BACKGROUND ART

In advanced manufacturing of masks, there has been employed a technique that feeds back the quality of mask blanks being a material of the masks. For example, a method is known that performs pattern formation while avoiding a defective portion of a mask blank (see, e.g. Japanese Unexamined Patent Application Publication (JP-A) No. 2001-33941 (Patent Document 1)).

In order to perform such feedback, it is necessary to identify individual mask blanks. For this purpose, there have been proposed, for example, a mask blank formed with a marker for identifying or managing a mask blank glass substrate and a mask blank provided with an optically readable area code on an end face or the like of a mask blank glass substrate (see, e.g. Japanese Unexamined Patent Application Publication (JP-A) No. 2006-309143 (Patent Document 2) and Japanese Unexamined Patent Application Publication (JP-A) No. 2002-116533 (Patent Document 3)).

DISCLOSURE OF THE INVENTION

For performing pattern formation while avoiding a defective portion of a mask blank, defect information including the type and coordinates of a defect and so on is assigned to the mask blank, for example. Then, when producing a mask, the defective portion is avoided based on the defect information. As a method of avoiding the defective portion, it is considered, for example, to use the mask blank by rotating it in a plane parallel to its main surface, thereby changing the orientation of the mask blank so as to avoid the position of the defect.

However, in the case of using, for example, a mask blank formed with a marker on an end face of a substrate, if the orientation of the mask blank is changed, the orientation of the end face formed with the marker also changes. As a result, the orientation of an end face formed with a marker differs per mask blank and thus it is difficult to manage the mask blanks.

Further, if the orientations of the end faces, formed with the markers, of the mask blanks vary from each other, it is difficult to automatically read the markers using a reader, for example, in a mask manufacturing process. As a result, for example, there is also a possibility that it becomes difficult to automate the mask manufacturing process.

It is therefore an object of this invention to provide a mask blank substrate manufacturing method, a mask blank manufacturing method, a mask manufacturing method, and a mask blank substrate, which can solve the above problems.

For accomplishing the above object, this invention has the following structures.

(Structure 1) A mask blank substrate manufacturing method comprising a substrate preparing step of preparing a plate-like substrate with a rectangular main surface, and a marker forming step of forming a marker for identifying or managing the substrate on each of at least a plurality of end faces among four end faces of the substrate, the four end faces continuous with sides of the main surface, respectively.

The substrate preparing step, for example, prepares an optically transparent substrate such as a glass substrate. Further, the substrate preparing step, for example, prepares the substrate ground to a predetermined shape. In this case, for example, a polishing step of polishing the substrate is performed after the marker forming step. The substrate preparing step may prepare a substrate having been polished. The marker for identifying the substrate is, for example, a marker indicative of identification information, for example, an identification code such as an identification number or identification symbols or a managing code such as a managing number or managing symbols, unique to the substrate. This marker is used for managing a mask blank substrate while being mapped to, for example, defect information including the type and coordinates of a defect and so on. The marker may be mapped to information about the properties of the mask blank substrate, other than the defect, such as, for example, the shape or the optical properties thereof. On the other hand, the marker for managing the substrate is, for example, a marker that directly indicates information for managing the substrate, such as information about the properties of the mask blank substrate.

With this configuration, for example, when rotating the mask blank substrate or a mask blank after the formation of the markers, it is easy to secure the state where one of the markers is oriented in a predetermined direction. This makes it possible to read one of the markers from a fixed direction even after rotating the mask blank or the like. Therefore, for example, it is possible to properly rotate a mask blank, manufactured by using this mask blank substrate, in response to need in the mask manufacturing process. Accordingly, with this configuration, it is possible to properly identify or manage individual mask blank substrates and mask blanks. Further, for example, it is possible to properly form a mask pattern while avoiding a defective portion. Furthermore, for example, it is also possible to properly form a mask pattern according to the properties such as the shape or the optical properties.

The marker forming step forms each marker, for example, by irradiating laser light onto the end face of the substrate. This makes it possible to properly form the marker that hardly becomes a particle generation source. The marker forming step may further form a second marker on one of the end faces where the markers are formed, wherein the second marker enables such an end face to be distinguished from the other. With this configuration, for example, by using the second marker as an origin mark, it is possible to properly recognize an initial position of rotation of the mask blank or the like.

(Structure 2) The mask blank substrate manufacturing method according to Structure 1, wherein the marker forming step forms the marker on each of the four end faces.

Since the main surface is rectangular, when rotating the mask blank substrate or the mask blank, the rotation angle is normally 90 degrees, 180 degrees, or 270 degrees. Therefore, with this configuration, even when using any of the rotation angles, it is possible to secure the state where one of the markers is oriented in the predetermined direction.

(Structure 3) The mask blank substrate manufacturing method according to Structure 2, wherein the marker forming step forms, as the marker, a marker comprising a common marker portion common to the four end faces, and an end face unique marker portion that differs among the four end faces.

The end face unique marker portion indicates, for example, a position of the end face where the end face unique marker portion concerned is formed.

If the markers formed on the four end faces are the same, it is not possible to identify the respective end faces by the markers. Therefore, for example, it is also not possible to confirm a rotation angle by reading the marker after rotating the mask blank or the like.

On the other hand, if configured as described above, it is possible to identify the four end faces, respectively. Accordingly, for example, by reading the marker on the end face oriented in the fixed direction, it is possible to confirm a rotation angle of the mask blank or the like. This makes it possible to more properly manage the mask blank substrate manufacturing process and the subsequent mask blank and mask manufacturing processes and so on.

(Structure 4) The mask blank substrate manufacturing method according to Structure 1, further comprising a substrate property obtaining step of obtaining property in-plane distribution information indicative of a distribution of a property of the substrate on the main surface and storing the property in-plane distribution information in a storage medium adapted to store the property of the substrate, wherein the property in-plane distribution information is stored in the storage medium so as to be mapped to the markers formed on the substrate.

With this configuration, for example, in the mask manufacturing process, when rotating a mask blank, manufactured by using this mask blank substrate, to change an orientation thereof, it is possible to properly select a direction suitable for the in-plane distribution of the property of the substrate. This makes it possible to properly manufacture a mask depending on the property of the mask blank substrate. Further, for example, when analyzing the property of the mask after the manufacture thereof, it is possible to properly perform an analysis based on the property in-plane distribution information. Furthermore, for example, when performing a failure analysis of semiconductor devices or the like manufactured by using the mask, the property in-plane distribution information can be properly used.

The distribution of the property of the substrate on the main surface is, for example, a two-dimensional distribution of the property of the substrate in a plane parallel to the main surface and is, for example, a distribution in which the properties of the substrate corresponding to respective positions of the main surface are mapped to the respective positions of the main surface. As the property in-plane distribution information, it is considered to use, for example, information representing a defect distribution, a distribution of the shape of a substrate, or a distribution of the optical property. As the information representing the defect distribution, use can be made, for example, of information including the type and coordinates of a defect. As the information representing the distribution of the shape of a substrate, use can be made, for example, of information representing the height or depth at each of positions on the main surface with respect to a predetermined reference plane. As the information representing the distribution of the optical property, use can be made, for example, of information representing a transmittance at each of positions on the main surface or information representing a birefringence distribution on the main surface. The birefringence distribution is, for example, a distribution of birefringence intensities at respective positions on the main surface or a distribution of angles of polarization azimuth axes at respective positions on the main surface. The property in-plane distribution information may be information representing areas where the above property deviates from a predetermined reference range.

(Structure 5) A mask blank manufacturing method for manufacturing a mask blank for use in manufacturing a mask for photolithography, the mask blank manufactured by using a mask blank substrate manufactured by the mask blank substrate manufacturing method according to Structure 1, the mask blank manufacturing method comprising a thin film forming step of forming a mask pattern thin film on the mask blank substrate, and a thin film property obtaining step of obtaining thin film information indicative of a property of the mask pattern thin film and storing the thin film information in a storage medium so as to be mapped to the markers.

(Structure 6) The mask blank manufacturing method according to Structure 5, further comprising a resist film forming step of forming a resist film on the mask pattern thin film, and a resist property obtaining step of obtaining resist information indicative of a property of the resist film and storing the resist information in the storage medium so as to be mapped to the markers.

(Structure 7) A mask manufacturing method for manufacturing a mask for photolithography, the mask manufacturing method comprising a blank preparing step of preparing the mask blank according to Structure 6, a step of reading the marker of the mask blank and referring to the storage medium, thereby obtaining mask blank information including the property in-plane distribution information, the thin film information, and the resist information corresponding to the marker, a rotation angle determining step of determining, based on the mask blank information, a direction with respect to a mask pattern to be transferred to the mask pattern thin film on the basis of the specific marker of the mask blank, thereby determining a rotation angle for rotating the mask blank, and a patterning step of placing the mask blank in a writing system with the mask blank rotated by the rotation angle determined on the basis of the specific marker in the rotation angle determining step, and then writing the mask pattern on the resist film.

(Structure 8) A mask blank substrate for use in manufacturing a mask blank, the mask blank substrate having a plurality of end faces each formed with a marker for identifying or managing the mask blank substrate.

(Structure 9) The mask blank substrate according to Structure 8, wherein the marker is formed on each of four end faces of the mask blank substrate.

(Structure 10) The mask blank substrate according to Structure 9, wherein the marker comprises a common marker portion common to the four end faces and an end face unique marker portion that differs among the four end faces.

According to this invention, for example, it is possible to properly identify or manage mask blank substrates, mask blanks, and so on.

BRIEF DESCRIPTION OF THE DRAWINGS

FIGS. 1A and 1B are diagrams for explaining an example of a structure of a mask blank substrate 10 according to an embodiment of this invention, wherein FIG. 1A is a perspective view of the mask blank substrate 10 and FIG. 1B illustrates an example of a detailed structure of a marker 106a formed on an end face 104a;

FIGS. 3A and 3B are diagrams for explaining a mask blank 20 manufactured by using the mask blank substrate 10, wherein FIG. 3A illustrates an example of a structure of the mask blank 20 and FIG. 3B is a flowchart showing an example of a manufacturing method of the mask blank 20;

FIGS. 4A and 4B are diagrams for explaining a mask 30 manufactured by using the mask blank 20, wherein FIG. 4A illustrates an example of a structure of the mask 30 and FIG. 4B is a flowchart showing an example of a manufacturing method of the mask 30;

FIGS. 5A and 5B are diagrams each illustrating an example of a state where the mask blank 20 is placed in a writing system 40, wherein FIG. 5A illustrates the state where the mask blank 20 is placed given that a rotation angle is set to 0 degrees, and FIG. 5B illustrates the state where the mask blank 20 is placed given that a rotation angle is set to 90 degrees; and FIGS. 6A and 6B are diagrams for explaining modifications of a mask blank substrate according to this invention, respectively, wherein FIG. 6A illustrates a first modification of the mask blank substrate 10 and FIG. 6B illustrates a second modification of the mask blank substrate 10.

BEST MODE FOR CARRYING OUT THE INVENTION

Figure 1A:
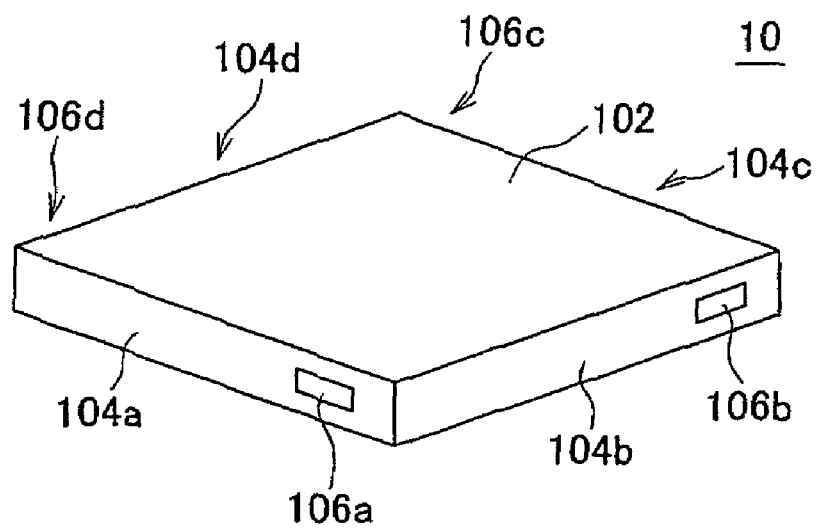
Figure 1B:
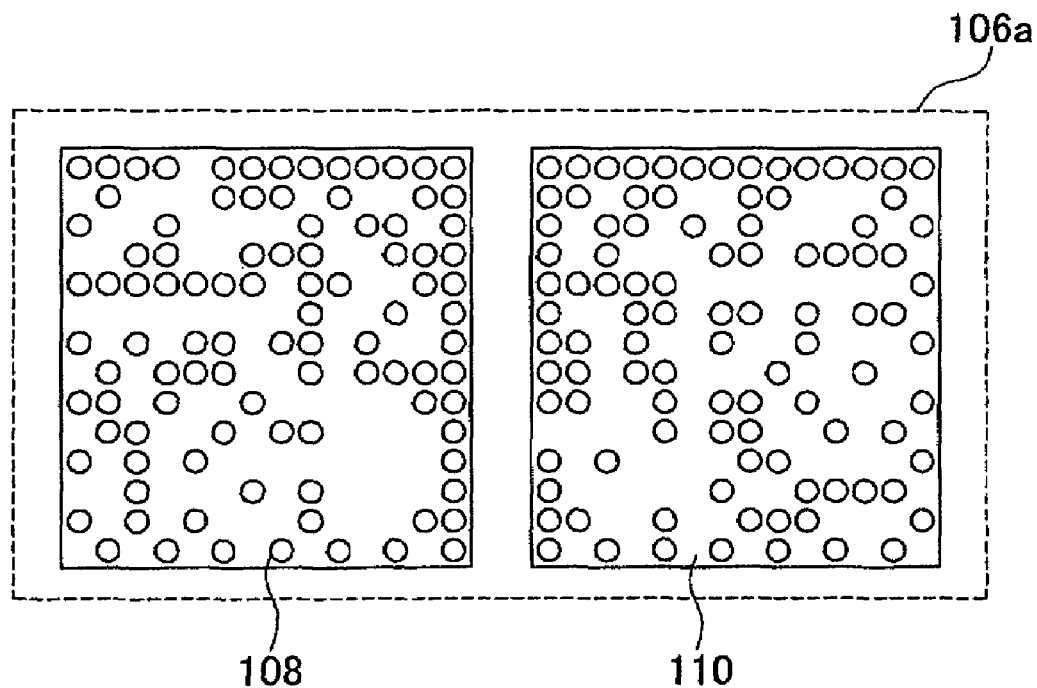

Hereinbelow, an embodiment according to this invention will be described with reference to the drawings. FIGS. 1A and 1B are diagrams for explaining an example of a structure of a mask blank substrate 10 according to the embodiment of this invention. FIG. 1A is a perspective view of the mask blank substrate 10. In this embodiment, the mask blank substrate 10 is a glass substrate having a square main surface 102, wherein markers 106a, 106b, 106c, and 106d are formed on four end faces 104a, 104b, 104c, and 104d, respectively, which are continuous with four sides of the main surface 102, respectively.

FIG. 1B illustrates an example of a detailed structure of the marker 106a formed on the end face 104a. In this embodiment, the marker 106a is a marker for identifying the mask blank substrate 10 and has a common marker portion 108 and an end face unique marker portion 110. The common marker portion 108 is a portion indicative of information common to the four end faces 104a to 104d. The end face unique marker portion 110 is a portion indicative of information that differs among the four end faces 104a to 104d. The markers 106b, 106c, and 106d formed on the other end faces 104b, 104c, and 104d each have the same common marker portion 108 as that of the marker 106a and an end face unique marker portion 110 that differs among the respective end faces 104a to 104d.

According to this embodiment, identification information unique to the mask blank substrate 10 can be properly indicated by the common marker portion 108 in each of the markers 106a to 106d. Further, the respective end faces 104a to 104d can be properly identified by the end face unique marker portions 110 in the respective markers 106a to 106d.

In this embodiment, the common marker portion 108 and the end face unique marker portion 110 are, for example, optically readable two-dimensional codes, respectively. The common marker portion 108 indicates an identification code such as an identification number or identification symbols, a managing code such as a managing number or managing symbols, or the like unique to the mask blank substrate 10. The end face unique marker portion 110 indicates a number, symbols, or the like for identifying one of the end faces 104a to 104d. As the two-dimensional code for use as each of the common marker portion 108 and the end face unique marker portion 110, there are, for example, a data matrix, a QR code, an SP code, VeriCode, MaxiCode, a CP code, Codel, Aztec-Code, Intacta Code, Card-e, and so on. Particularly, the data matrix is preferable.

The marker is provided on the end face of the substrate in this embodiment, but may be provided on a chamfered surface formed between the main surface and the end face, on a notch mark forming portion formed between the main surface and the end face, or on the main surface in a peripheral area outside an area where a transfer pattern is formed. As the end face unique marker portion 110, a marker with an information amount smaller than that of the common marker portion 108 may be formed. Further, as each of the markers 106a to 106d, there may be formed a single two-dimensional code, barcode, or the like including both the common marker portion 108 and the end face unique marker portion 110. In this case, for example, two-dimensional codes, barcodes, or the like partly different from each other are formed as the markers 106a to 106d.

Figure 2:
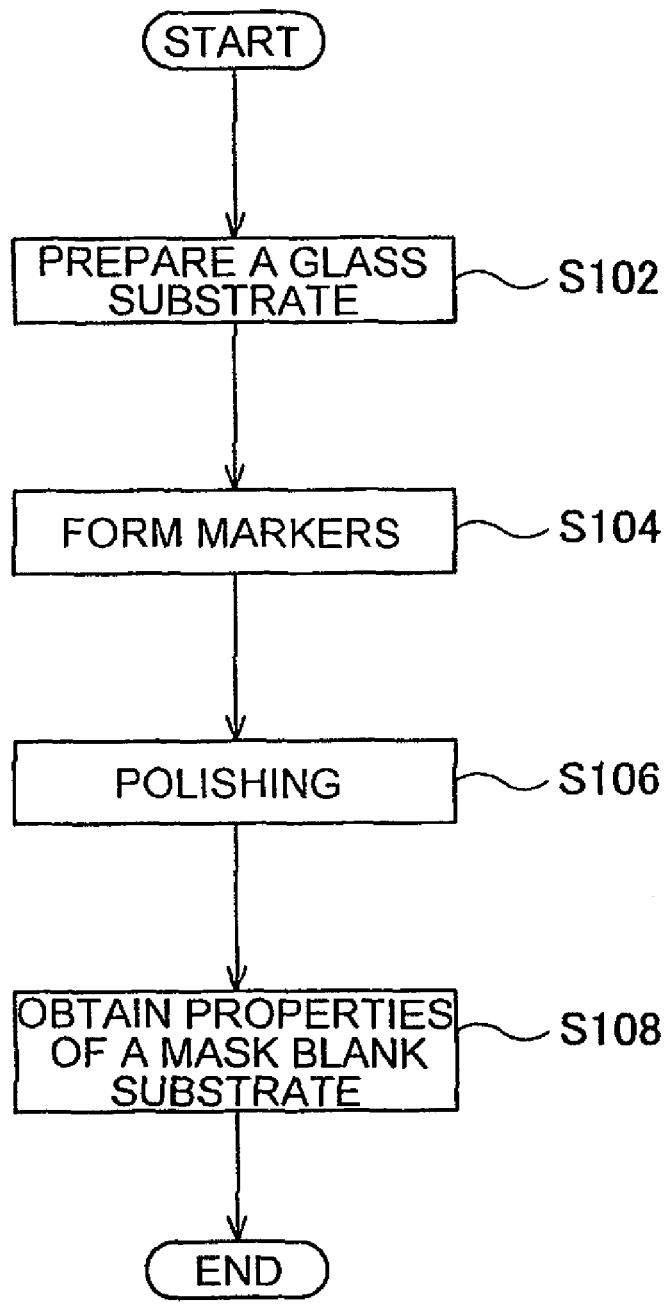
FIG. 2 is a flowchart showing an example of a manufacturing method of the mask blank substrate 10.

FIG. 2 is a flowchart showing an example of a manufacturing method of the mask blank substrate 10. In the manufacturing process of the mask blank substrate 10 according to this embodiment, there is prepared, at first, a glass substrate ground to a plate shape with a square main surface (substrate preparing step S102). Then, the markers 106a to 106d are formed on the end faces 104a to 104d, respectively, of the glass substrate (marker forming step S104). Accordingly, the marker forming step S104 forms the markers 106a to 106d in areas, having no influence on transfer, of a mask blank that is manufactured by using the mask blank substrate 10. The marker forming step S104 forms the markers 106a to 106d, for example, by irradiation of laser light of a carbon dioxide gas laser or the like. Then, after the formation of the markers 106a to 106d, the main surface 102 and the end faces 104a to 104d of the glass substrate are polished to predetermined surface roughnesses (polishing step S106).

Subsequently, property in-plane distribution information representing a distribution of the properties of the glass substrate on the main surface thereof is obtained, which, for example, doubles as an inspection of the mask blank substrate 10. Then, the obtained property in-plane distribution information is stored, correlated with or mapped to the markers 106a to 106d, in a storage medium for use in storing the properties of mask blank substrates (substrate property obtaining step S108). This storage medium is, for example, a database for managing the properties of mask blank substrates.

Herein, as the property in-plane distribution information, it is considered to use, for example, information representing a defect distribution, a distribution of the shape of a substrate, or a distribution of the optical properties. As the information representing the defect distribution, use can be made, for example, of information including the type and coordinates of a defect. In this event, information about a positional relationship between at least one of the markers 106a to 106d and the origin of a coordinate system is stored in the storage medium. As the information representing the distribution of the shape of a substrate, use can be made, for example, of information representing the height or depth at each of positions on the main surface with respect to a predetermined reference plane. As the information representing the distribution of the optical properties, use can be made, for example, of information representing a transmittance at each of positions on the main surface or information representing a birefringence distribution on the main surface.

According to this embodiment, for example, by forming the markers 106a to 106d on the glass substrate in the initial step before the polishing, the polishing step S106 and so on thereafter can be carried out by identifying the glass substrate. This makes it possible, for example, to carry out the management of the steps more precisely and thus to properly manage the mask blank substrate manufacturing process.

Further, by mapping the property in-plane distribution information of the glass substrate to the markers 106a to 106d, the properties of the mask blank substrate 10 can be properly grasped also in the mask blank and mask manufacturing processes which will be carried out using the mask blank substrate 10. This makes it possible to more properly manufacture mask blanks and masks depending on the properties of respective mask blank substrates. Further, the mask blank and mask manufacturing processes can be managed more properly.

The substrate preparing step S102 may prepare a glass substrate having been subjected to the polishing step S106. In this case, the marker forming step S104 forms the markers 106a to 106d on the glass substrate having been polished. Further, the marker forming step S104 may be performed after the substrate property obtaining step S108. In this case, the marker forming step S104 may form markers each directly indicating information for managing a mask blank substrate, such as information representing the properties of a mask blank substrate.

Figure 3A:
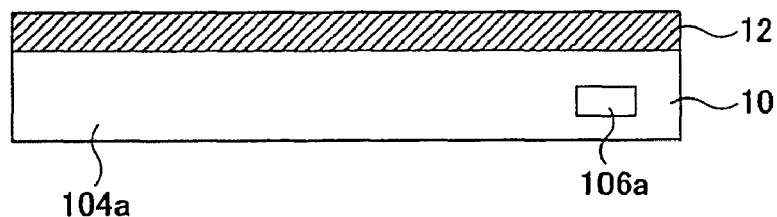
Figure 3B:
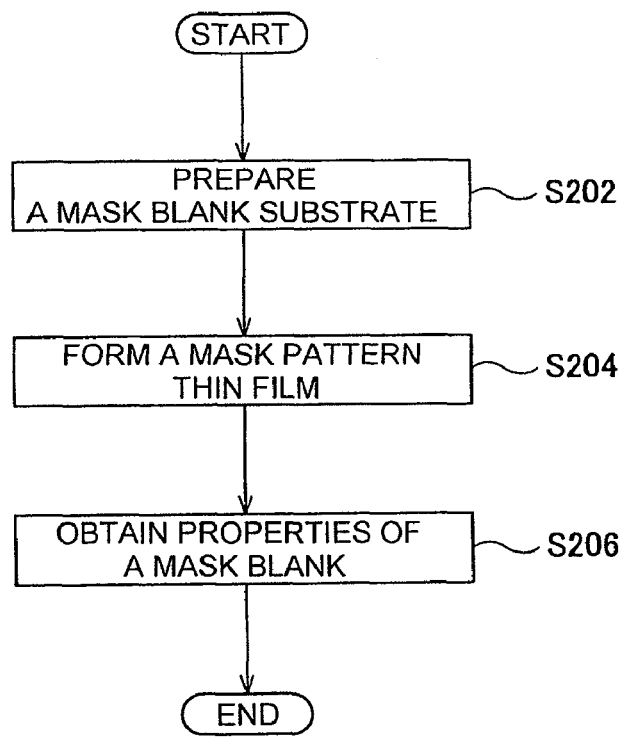

FIGS. 3A and 3B are diagrams for explaining a mask blank 20 manufactured by using the mask blank substrate 10. FIG. 3A illustrates an example of a structure of the mask blank 20. In this embodiment, the mask blank 20 comprises the mask blank substrate 10 and a mask pattern thin film 12. The mask pattern thin film 12 is a light-shielding film, an optically semitransparent film, or the like for forming a mask pattern in the photomask manufacturing process and is formed on the mask blank substrate 10. The mask pattern thin film 12 may be a laminate of a plurality of kinds of thin films. The mask blank 20 may further have a resist film formed on the mask pattern thin film 12.

FIG. 3B is a flowchart showing an example of a manufacturing method of the mask blank 20. In the manufacturing process of the mask blank 20 according to this embodiment, there is prepared, at first, the mask blank substrate 10 manufactured by the manufacturing method described with reference to FIG. 2 (blank substrate preparing step S202). Then, the mask pattern thin film 12 is formed on the mask blank substrate 10 (thin film forming step S204).

Subsequently, mask blank information representing the properties of the mask blank 20 is obtained, which, for example, doubles as an inspection of the mask blank 20. Then, the obtained mask blank information is stored, mapped to the markers 106a to 106d, in a storage medium for use in storing the properties of mask blanks (blank property obtaining step S206). This storage medium is, for example, a database for managing the properties of mask blanks.

Herein, in this embodiment, the blank property obtaining step S206 includes at least an in-use shape information obtaining step. The in-use shape information obtaining step obtains, as at least part of the mask blank information, in-use shape information of a mask manufactured by using the mask blank 20. Then, the obtained in-use shape information is stored, mapped to the markers 106a to 106d, in the storage medium for use in storing the properties of mask blanks. The in-use shape information of a mask is, for example, information representing the main surface shape of a mask manufactured by using the mask blank 20 in the state where the mask is placed in an exposure system. This exposure system is, for example, a stepper.

According to this embodiment, for example, the mask blank information such as the in-use shape information can be suitably used in the mask manufacturing process. This makes it possible to more properly manufacture masks depending on the properties of respective mask blanks.

The in-use shape information obtaining step obtains in-use shape information, for example, by simulation based on the main surface shape of a mask blank. It may be arranged that the in-use shape information obtaining step sets the mask blank 20 before being processed into a mask in the exposure system to measure the surface shape thereof and then calculates in-use shape information based on the measurement results.

The blank property obtaining step S206 may further include a thin film property obtaining step that obtains thin film information representing the properties of the mask pattern thin film 12. In the case where the mask blank 20 further comprises the resist film, the blank property obtaining step S206 may further include a resist property obtaining step that obtains resist information representing the properties of the resist film. In this case, the thin film property obtaining step and the resist property obtaining step store the obtained thin film information and resist information in the storage medium for use in storing the properties of mask blanks while mapping them to the markers 106a to 106d. The thin film information is, for example, information representing a distribution of defect or the like of the mask pattern thin film 12 on the main surface. The resist information is, for example, information representing a distribution of defect or the like of the resist film on the main surface.

Figure 4A:
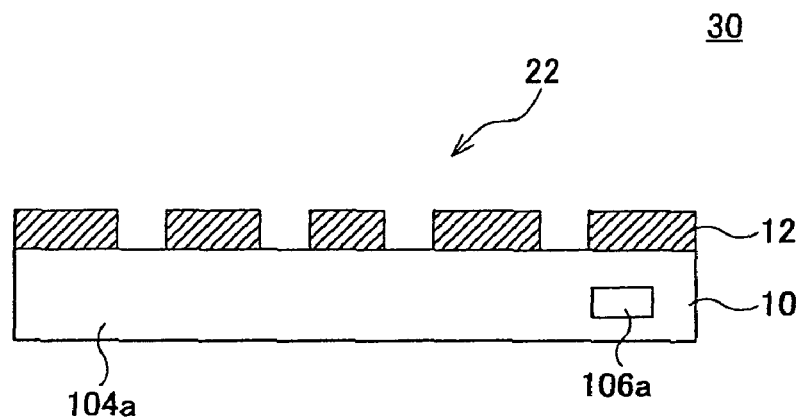
Figure 4B:
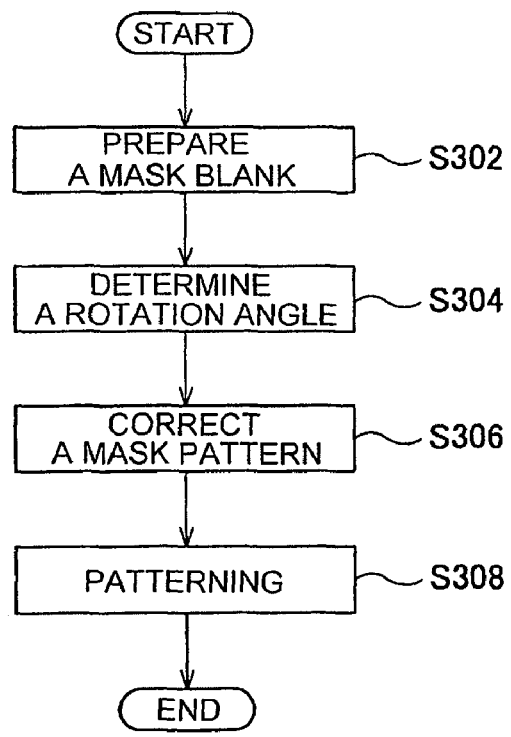

FIGS. 4A and 4B are diagrams for explaining a mask 30 manufactured by using the mask blank 20. FIG. 4A illustrates an example of a structure of the mask 30. In this embodiment, the mask 30 comprises the mask blank substrate 10 and the mask pattern thin film 12. The mask pattern thin film 12 is patterned into a predetermined mask pattern 22.

FIG. 4B is a flowchart showing an example of a manufacturing method of the mask 30. In the manufacturing process of the mask 30 according to this embodiment, there is prepared, at first, the mask blank 20 manufactured by the manufacturing method described with reference to FIG. 3B (blank preparing step S302).

Then, a rotation angle representing a placement posture of the mask blank 20 when writing the mask pattern 22 is determined (rotation angle determining step S304). This rotation angle is, for example, an angle indicating in which direction and by how many degrees the mask blank 20 should be rotated in a plane parallel to the main surface 102 (see FIG. 1A) from an orientation in which the mask blank 20 is currently placed to an orientation in which the mask blank 20 is optimally placed with respect to the mask pattern 22, whose orientation is fixed, to be formed in the mask pattern thin film 12. The rotation angle is determined on the basis of the marker provided on the preset one of the end faces of the mask blank 20 (the specific marker, e.g. the marker 106a). The rotation angle determining step S304 selects, for example, one of 0, 90, 180, and 270 degrees as the rotation angle.

Herein, in this embodiment, the rotation angle determining step S304 reads at least one of the markers 106a to 106d on the mask blank substrate 10. Then, the step S304 obtains the property in-plane distribution information corresponding to the read marker 106 from the storage medium storing the properties of the mask blank substrates. Further, the step S304 obtains the mask blank information including the in-use shape information and so on from the storage medium storing the properties of the mask blanks. Then, based on the obtained property in-plane distribution information and mask blank information, the step S304 determines a rotation angle for rotating the mask blank 20.

According to this embodiment, it is possible to properly determine a rotation angle depending on the distribution of the properties of the mask blank substrate 10 on the main surface thereof. For example, using the defect information as the property in-plane distribution information, it is possible to form a mask pattern at a position avoiding a defect. Further, for example, using the information such as the shape or the optical properties as the property in-plane distribution information, it is possible to form a mask pattern suitable for a distribution thereof. Further, by determining a rotation angle based on the in-use shape information, it is possible, for example, to determine the rotation angle optimum for a change in the main surface shape of the mask 30 in its use. This makes it possible to properly enhance the positional accuracy of the mask pattern 22.

Then, subsequently to the rotation angle determining step S304, correction of the mask pattern 22 before the writing is carried out (pattern correcting step S306). The correction of the mask pattern 22 is, for example, correction of mask pattern data for use in writing the mask pattern 22.

In this embodiment, the pattern correcting step S306 reads at least one of the markers 106a to 106d on the mask blank substrate 10. Then, the step S306 obtains the in-use shape information corresponding to the read marker 106 from the storage medium storing the properties of the mask blanks. Then, based on the obtained in-use shape information, the step S306 corrects the mask pattern 22.

According to this embodiment, it is possible to correct the mask pattern 22 with high accuracy by anticipating in advance a change in the main surface shape of the mask 30 due to the placement thereof in the exposure system. Therefore, for example, it is possible to properly reduce the influence of the change in the main surface shape of the mask 30 in its use. This makes it possible to enhance the positional accuracy of the mask pattern 22 more properly.

The pattern correcting step S306 may use the in-use shape information obtained in the rotation angle determining step S304. In this case, the pattern correcting step S306 obtains, through the rotation angle determining step S304, the in-use shape information from the storage medium storing the properties of the mask blanks. Further, the pattern correcting step S306 may correct the mask pattern 22 after placing the mask blank 20 in a writing system such as an electron beam exposure system.

Subsequently to the pattern correcting step S306, the mask pattern thin film 12 is patterned by a photolithography process (patterning step S308). This photolithography process, for example, irradiates an electron beam onto the resist film formed on the mask pattern thin film 12, thereby writing the mask pattern 22 to be formed. Then, development, etching, and so on are further performed, thereby patterning the mask pattern thin film 12.

In this embodiment, the patterning step S308 performs the writing by the electron beam using the writing system such as the electron beam exposure system. Further, the patterning step S308 places the mask blank 20 in the exposure system so that the end face 104a being the preset one of the end faces is oriented in a direction of the rotation angle determined in the rotation angle determining step S304.

Accordingly, the patterning step S308 rotates the mask blank 20 depending on the rotation angle determined in the rotation angle determining step S304. Therefore, according to this embodiment, it is possible to properly rotate the mask blank 20 with respect to the mask pattern 22 to be formed. This makes it possible, for example, to properly manufacture the mask 30 depending on the properties of the mask blank substrate 10 and the mask blank 20.

Figure 5A:
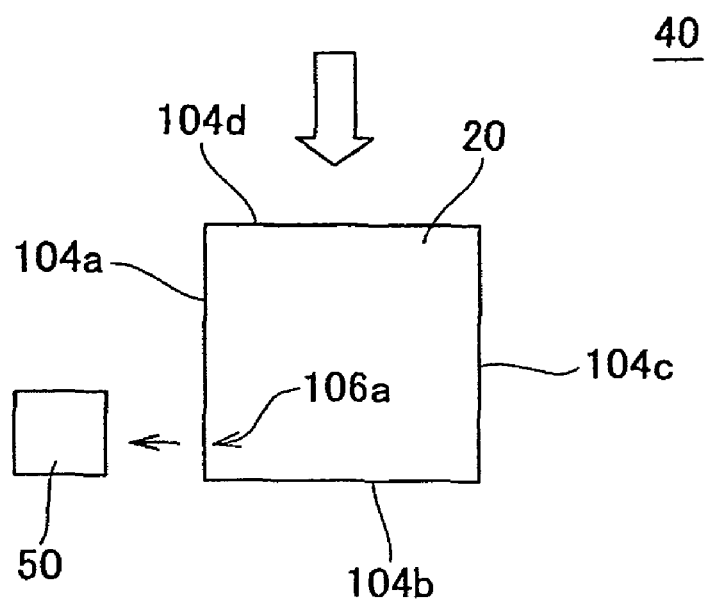
Figure 5B:
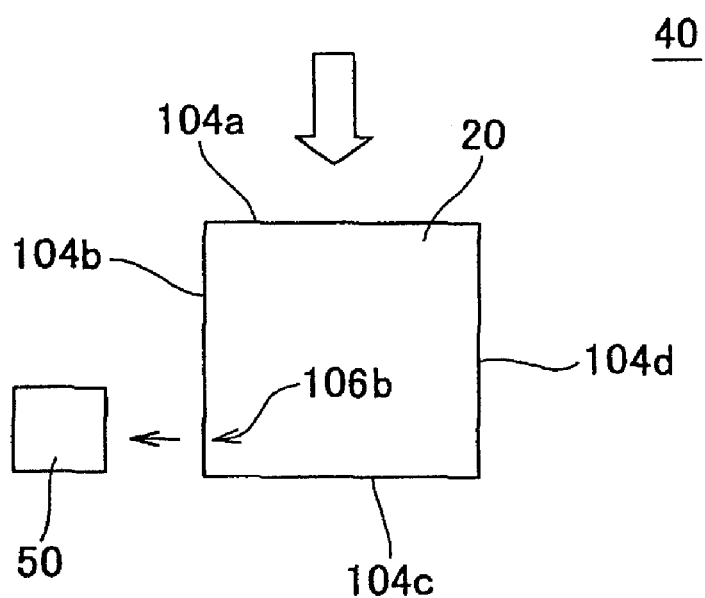

FIGS. 5A and 5B each illustrate an example of a state where the mask blank 20 is placed in a writing system 40. In this embodiment, the writing system 40 has a reader 50 for reading the marker on the end face, oriented in a predetermined direction, of the mask blank substrate 10 of the mask blank 20.

FIG. 5A illustrates the state where the mask blank 20 is placed given that the rotation angle is set to 0 degrees. In this state, the mask blank 20 is placed in the writing system 40 in an orientation so that the marker 106a on the end face 104a faces the reader 50. FIG. 5B illustrates the state where the mask blank 20 is placed given that the rotation angle is set to 90 degrees. In this state, the mask blank 20 is rotated clockwise by 90 degrees from the state of FIG. 5A and thus is placed in the writing system 40 in an orientation so that the marker 106b on the end face 104b faces the reader 50.

Although illustration is omitted, when the rotation angle is set to 180 degrees, the mask blank 20 is placed in the writing system 40 in an orientation so that the marker 106c (see FIG. 1A) on the end face 104c faces the reader 50. When the rotation angle is set to 270 degrees, the mask blank 20 is placed in the writing system 40 in an orientation so that the marker 106d (see FIG. 1A) on the end face 104d faces the reader 50.

As described above, in this embodiment, when rotating the mask blank 20, it is possible to secure the state where one of the markers 106a to 106d faces the reader 50. This makes it possible to read one of the markers 106a to 106d from the reader 50 located in the fixed direction even after rotating the mask blank 20. Therefore, according to this embodiment, it is possible to properly rotate the mask blank 20 in response to need in the mask manufacturing process.

In this embodiment, the writing system 40 identifies the mask blank 20 placed therein on the basis of the common marker portion 108 (see FIG. 1B) in one of the markers 106a to 106d read by the reader 50. Further, the writing system 40 identifies a rotation angle of the mask blank 20 on the basis of the end face unique marker portion 110 (see FIG. 1B) in the read one of the markers 106a to 106d. Based on this identification, the writing system 40 confirms that the placed mask blank 20 and the rotation angle of the mask blank 20 are correct. Therefore, according to this embodiment, it is possible, for example, to properly manage individual mask blanks and rotation angles thereof at the time of writing. This makes it possible, for example, to properly promote automation of the mask manufacturing process.

In this embodiment, the rotation of the mask blank 20 is carried out, for example, before placing it in the writing system 40. The rotation of the mask blank 20 may be carried out in the writing system 40. In this case, the writing system 40, for example, further has a rotating unit for rotating the mask blank 20. For example, the writing system 40 identifies a rotation angle indicative of an orientation of the mask blank 20 before rotation on the basis of the end face unique marker portion 110 of one of the markers 106a to 106d and then rotates the mask blank 20 using the rotating unit from the identified rotation angle to a rotation angle determined in the rotation angle determining step.

In the mask manufacturing process, not only at the time of the writing of the mask pattern 22, but also at the time of other processings, inspection, and so on, it is preferable to read the markers 106a to 106d to thereby identify the mask blank 20. If necessary, it is preferable to identify the rotation angle of the mask blank 20 based on the end face unique marker portions 110 of the markers 106a to 106d. In this case, manufacturing systems used in the respective processings, an inspection system used in the inspection, and so on each have, for example, a reader the same as or similar to that of the writing system 40. This makes it possible to more properly manage individual mask blanks.

Figure 6A:
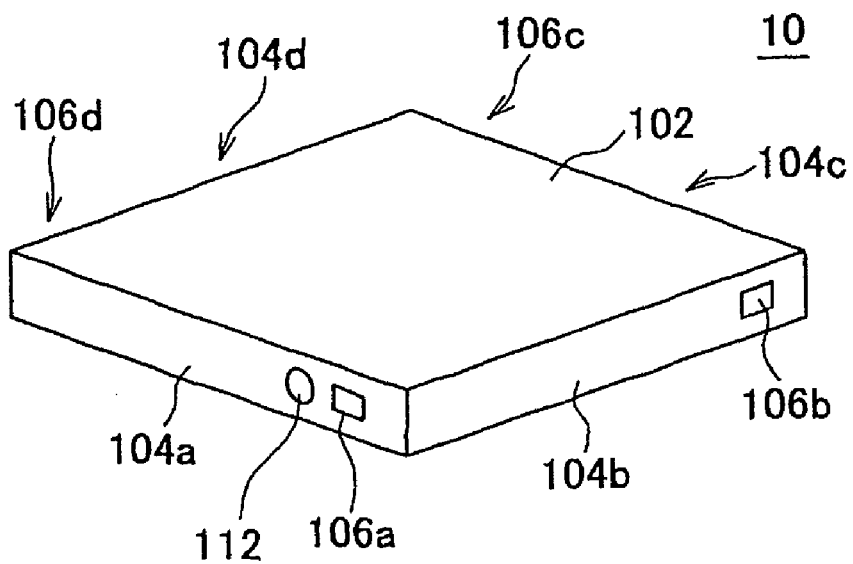
Figure 6B:
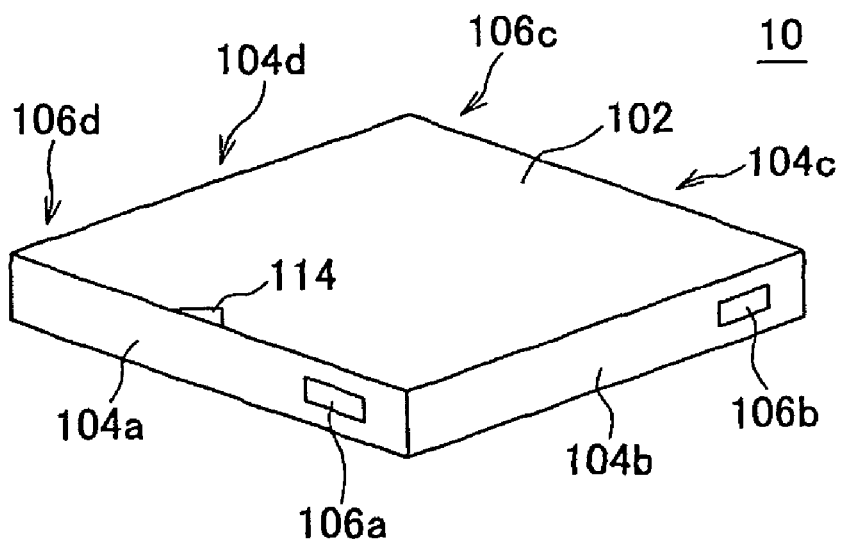

FIGS. 6A and 6B are diagrams for explaining modifications of a mask blank substrate according to this invention, respectively. FIG. 6A illustrates a first modification of the mask blank substrate 10. In this modification, four end faces 104a to 104d are respectively formed with markers 106a to 106d indicative of the same information. In this case, the markers 106a to 106d each may be, for example, the same as or similar to the common marker portion 108 described with reference to FIG. 1B.

Among the end faces 104a to 104d, only the end face 104a is formed with an origin mark 112 in addition to the marker 106a. The origin mark 112 is a marker that enables the end face 104a to be distinguished from the other end faces 104b, 104c, and 104d. Also in this modification, a mask blank 20 can be properly managed with the markers 106a to 106d. Further, for example, by confirming an orientation of the end face 104a formed with the origin mark 112, it is possible to properly recognize an initial position of rotation of the mask blank 20 manufactured by using the mask blank substrate 10. This makes it possible to properly manage rotation angles of individual mask blanks.

FIG. 6B illustrates a second modification of the mask blank substrate 10. In this modification, the mask blank substrate 10 is further formed with a visual observation marker 114. The visual observation marker 114 is formed, for example, at an edge portion of a main surface 102. This makes it possible to easily confirm whether the main surface 102 of the mask blank substrate 10 faces upward or downward. Further, the visual observation marker 114 is formed, for example, near an end face 104a. This makes it possible to distinguish the end face 104a from the other end faces 104b, 104c, and 104d.

In this modification, markers 106a to 106d are the same as or similar to the markers 106a to 106d described with reference to FIG. 1B. According to this modification, a rotation angle of a mask blank 20 can be confirmed not only by confirmation of the rotation angle based on reading of the markers 106a to 106d, but also by operator's visual observation. This makes it possible, for example, to easily confirm the rotation angle of the mask blank 20 by operator's visual observation when adjusting a reader for the markers 106a to 106d or confirming the operation of the reader.

The visual observation marker 114 is preferably formed in an area that has no influence on transfer when a mask 30 (see FIG. 4A) employing the mask blank substrate 10 is used, and further that can be easily confirmed by an operator. For example, the visual observation marker 114 may be formed on the end face 104a. Further, the visual observation marker 114 is also useful, for example, when rotating the mask blank 20 by an operator's manual or other operation. In this case, the operator confirms a rotation angle of the mask blank 20 using the visual observation marker 114.

While this invention has been described in terms of the embodiment, the technical scope of this invention is not to be limited thereto. It is readily understood by a person skilled in the art that various modifications or improvements can be added to the foregoing embodiment. It is apparent from the description of the claims that the modes added with those modifications or improvements can also be included in the technical scope of this invention.

This invention is suitably applicable to, for example, a mask blank substrate.

What is claimed is:

1. A mask blank substrate for use in manufacturing a mask blank, said mask blank substrate having four end faces and a rectangular main surface having four sides, said four end faces being continuous with the sides of said main surface, respectively, said mask blank substrate comprising a marker formed on each of four marker forming areas of said mask blank substrate for identifying or managing said mask blank substrate, wherein said four marker forming areas are
   four chamfered surfaces formed between said main surface and said four end faces,
   four notch mark forming portions formed between said main surface and said four end faces, or
   four areas on said main surface in a peripheral area outside an area where a transfer pattern is formed.

2. The mask blank substrate according to claim 1, wherein said marker comprises a common marker portion common to said four marker forming areas and a unique marker portion that differs among said four marker forming areas.

3. The mask blank substrate according to claim 1, further comprising an origin mark formed on one of said four marker forming areas, said origin mark defining an initial position of rotation of said mask blank substrate.

4. The mask blank substrate according to claim 1, further comprising a visual observation marker formed on at least one of said four end faces.

5. The mask blank substrate according to claim 1, further comprising a visual observation marker formed on the main surface.

6. A mask blank comprising a mask blank substrate and a thin film formed on said mask blank substrate, said mask blank substrate having four end faces and a rectangular main surface having four sides, said four end faces being continuous with the sides of said main surface, respectively, said mask blank substrate comprising a marker formed on each of four marker forming areas of said mask blank substrate for identifying or managing said mask blank substrate, wherein said four marker forming areas are
   said four end faces,
   four chamfered surfaces formed between said main surface and said four end faces,
   four notch mark forming portions formed between said main surface and said four end faces, or
   four areas on said main surface in a peripheral area outside an area where a transfer pattern is formed.

7. The mask blank according to claim 6, wherein said marker comprises a common marker portion common to said four marker forming areas and a unique marker portion that differs among said four marker forming areas.

8. The mask blank according to claim 6, further comprising an origin mark formed on one of said four marker forming areas, said origin mark defining an initial position of rotation of said mask blank substrate.

9. The mask blank according to claim 6, further comprising a visual observation marker formed on at least one of said four end faces.

10. The mask blank according to claim 6, further comprising a visual observation marker formed on the main surface.

11. A mask manufacturing method for manufacturing a mask for photolithography, said mask manufacturing method comprising:
   a blank preparing step of preparing the mask blank according to claim 6; and
   a transfer pattern forming step of forming said transfer pattern by patterning the thin film of said mask blank into said transfer pattern.

12. The mask manufacturing method according to claim 11, said transfer pattern forming step comprising:

a step of reading the marker of the mask blank and referring to a storage medium, thereby obtaining mask blank information representing a property of said mask blank corresponding to the marker;

a rotation angle determining step of determining, based on said mask blank information, a direction of the mask blank with respect to the transferred pattern to be transferred to the thin film, thereby determining a rotation angle for rotating the mask blank; and a patterning step of placing the mask blank in a writing system with the mask blank rotated by the rotation angle determined by said rotation angle determining step, and then writing the transferred pattern on the thin film.

13. The mask manufacturing method according to claim 11, further comprising:

a step of carrying out an inspection of said mask by reading the markers of said mask.

14. A mask for photolithography comprising a mask blank substrate and a thin film having a transfer pattern and formed on said mask blank substrate, said mask blank substrate having four end faces and a rectangular main surface having four sides, said four end faces being continuous with the sides of said main surface, respectively, said mask blank substrate comprising a marker formed on each of four marker forming areas of said mask blank substrate for identifying or managing said mask blank substrate, wherein said four marker forming areas are said four end faces, four chamfered surfaces formed between said main surface and said four end faces, four notch mark forming portions formed between said main surface and said four end faces, or four areas on said main surface in a peripheral area outside an area where said transfer pattern is formed.

15. The mask according to claim 14, wherein said marker comprises a common marker portion common to said four marker forming areas and a unique marker portion that differs among said four marker forming areas.

16. The mask according to claim 14, further comprising an origin mark formed on one of said four marker forming areas, said origin mark defining an initial position of rotation of said mask blank substrate.

17. The mask according to claim 14, further comprising a visual observation marker formed on at least one of said four end faces.

18. The mask according to claim 14, further comprising a visual observation marker formed on the main surface.

19. A semiconductor manufacturing method comprising a step of manufacturing a semiconductor by using the mask according to claim 14.

20. A mask blank substrate manufacturing method comprising:

a substrate preparing step of preparing a substrate having four end faces and a rectangular main surface having four sides, said four end faces being continuous with the sides of said main surface, respectively; and a marker forming step of forming a marker for identifying or managing said substrate on each of four marker forming areas of said substrate, wherein said four marker forming areas are four chamfered surfaces formed between said main surface and said four end faces, four notch mark forming portions formed between said main surface and said four end faces, or four areas on said main surface in a peripheral area outside an area where a transfer pattern is formed.

21. The mask blank substrate manufacturing method according to claim 20, wherein said marker forming step forms, as said marker, a marker comprising:

a common marker portion common to said four marker forming areas; and a unique marker portion that differs among said four marker forming areas.

22. The mask blank substrate manufacturing method according to claim 20, further comprising a substrate property obtaining step of obtaining property in-plane distribution information indicative of a distribution of a property of said substrate on said main surface and storing said property in-plane distribution information in a storage medium adapted to store the property of said substrate, wherein said property in-plane distribution information is stored in said storage medium so as to be mapped to said markers formed on said substrate.

23. The mask blank substrate manufacturing method according to claim 22, wherein said property in-plane distribution information comprises information representing a defect distribution, a distribution specifying a shape of said substrate, or a distribution of an optical property.

24. A mask blank manufacturing method for manufacturing a mask blank for use in manufacturing a mask for photolithography, said mask blank manufactured by using a mask blank substrate manufactured by the mask blank substrate manufacturing method according to claim 20, said mask blank manufacturing method comprising:

a thin film forming step of forming a mask pattern thin film on said mask blank substrate; and a thin film property obtaining step of obtaining thin film information indicative of a property of said mask pattern thin film and storing said thin film information in a storage medium so as to be mapped to said markers.

25. The mask blank manufacturing method according to claim 24, further comprising:

a resist film forming step of forming a resist film on said mask pattern thin film; and a resist property obtaining step of obtaining resist information indicative of a property of said resist film and storing said resist information in the storage medium so as to be mapped to said markers.

26. A mask manufacturing method for manufacturing a mask for photolithography, said mask manufacturing method comprising:

a blank preparing step of preparing the mask blank according to claim 25;

a step of reading the marker of the mask blank and referring to the storage medium, thereby obtaining mask blank information including the property in-plane distribution information, the thin film information, and the resist information corresponding to the marker;

a rotation angle determining step of determining, based on said mask blank information, a direction with respect to a mask pattern to be transferred to the mask pattern thin film on the basis of the specific marker of the mask blank, thereby determining a rotation angle for rotating the mask blank; and a patterning step of placing the mask blank in a writing system with the mask blank rotated by the rotation angle determined on the basis of the specific marker in said rotation angle determining step, and then writing the mask pattern on the resist film.

27. A mask blank substrate manufacturing method comprising:

a substrate preparing step of preparing a substrate having four end faces and a rectangular main surface having four sides, said four end faces being continuous with the sides of said main surface, respectively; and a marker forming step of forming a marker for identifying or managing said substrate on each of four marker forming areas of said substrate, wherein said four marker forming areas are said four end faces, four chamfered surfaces formed between said main surface and said four end faces, four notch mark forming portions formed between said main surface and said four end faces, or four areas on said main surface in a peripheral area outside an area where a transfer pattern is formed;

said mask blank substrate manufacturing method further comprising a substrate property obtaining step of obtaining property in-plane distribution information indicative of a distribution of a property of said substrate on said main surface and storing said property in-plane distribution information in a storage medium adapted to store the property of said substrate, wherein said property in-plane distribution information is stored in said storage medium so as to be mapped to said markers formed on said substrate and wherein said property in-plane distribution information comprises any one of information representing a defect distribution, a distribution specifying a shape of said substrate, and a distribution of an optical property.

28. A mask blank manufacturing method for manufacturing a mask blank for use in manufacturing a mask for photolithography, said mask blank manufacturing method comprising:

a substrate preparing step of preparing a substrate having four end faces and a rectangular main surface having four sides, said four end faces being continuous with the sides of said main surface, respectively;

a marker forming step of forming a marker for identifying or managing said substrate on each of four marker forming areas of said substrate, wherein said four marker forming areas are said four end faces, four chamfered surfaces formed between said main surface and said four end faces, four notch mark forming portions formed between said main surface and said four end faces, or four areas on said main surface in a peripheral area outside an area where a transfer pattern is formed;

a thin film forming step of forming a thin film on said substrate; and a mask blank property obtaining step of obtaining mask blank information representing a property of said mask blank and storing said mask blank information in a storage medium so as to be mapped to said markers formed on said substrate.

29. The mask blank manufacturing method according to claim 28, wherein said mask blank information comprises any one of property in-plane distribution information indicative of a distribution of a property of said substrate on said main surface, thin film information representing a property of said thin film, and in-use shape information of the mask manufactured by using said mask blank.

30. The mask blank manufacturing method according to claim 28, further comprising a resist film forming step of forming a resist film on said thin film, wherein said mask blank information comprises resist information representing a property of said resist film.

* * * * *